(12) United States Patent
Murata

(10) Patent No.: US 10,204,957 B2
(45) Date of Patent: Feb. 12, 2019

(54) IMAGING DEVICE AND IMAGING UNIT

(71) Applicant: NIKON CORPORATION, Tokyo (JP)

(72) Inventor: Hironobu Murata, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/869,662

(22) Filed: Jan. 12, 2018

(65) Prior Publication Data

US 2018/0175097 A1 Jun. 21, 2018

Related U.S. Application Data

(63) Continuation of application No. 14/646,039, filed as application No. PCT/JP2013/006816 on Nov. 20, 2013, now Pat. No. 9,905,604.

(30) Foreign Application Priority Data

Nov. 22, 2012 (JP) .................................. 2012-256891

(51) Int. Cl.
| | | |
|---|---|---|
| *H01L 27/146* | (2006.01) | |
| *H04N 5/225* | (2006.01) | |
| *H04N 5/232* | (2006.01) | |
| *H04N 5/369* | (2011.01) | |
| *H04N 5/3745* | (2011.01) | |

(52) U.S. Cl.
CPC .... *H01L 27/14645* (2013.01); *H01L 27/1461* (2013.01); *H01L 27/1463* (2013.01); *H01L 27/1464* (2013.01); *H01L 27/14603* (2013.01); *H01L 27/14607* (2013.01); *H01L 27/14612* (2013.01); *H01L 27/14621* (2013.01); *H01L 27/14623* (2013.01); *H04N 5/2254* (2013.01); *H04N 5/23209* (2013.01);
(Continued)

(58) Field of Classification Search
CPC ......... H01L 27/14645; H01L 27/14623; H01L 27/14621; H01L 27/14612; H01L 27/1464; H01L 27/1463; H01L 27/1461; H01L 27/14603; H04N 5/23212; H04N 5/2254; H04N 5/37452; H04N 5/23209; H04N 5/3696
USPC ........... 257/229, 615, 183; 438/33, 406, 107
See application file for complete search history.

(56) References Cited

U.S. PATENT DOCUMENTS

| | | |
|---|---|---|
| 2004/0004668 A1 | 1/2004 | Namazue et al. |
| 2005/0184322 A1 | 8/2005 | Inoue |

(Continued)

FOREIGN PATENT DOCUMENTS

| | | |
|---|---|---|
| JP | 2008-294479 A | 12/2008 |
| JP | 2011-061522 A | 3/2011 |
| JP | 2012-151774 A | 8/2012 |

OTHER PUBLICATIONS

Yasutomi et al., "A 2.7e-Temporal Noise 99.7% Shutter Efficiency 92dB Dynamic Range CMOS Image Sensor With Dual Global Shutter Pixels". ITE Technical Report, vol. 34, No. 16, pp. 25-28, 2010.

(Continued)

*Primary Examiner* — Bo Fan
(74) *Attorney, Agent, or Firm* — Oliff PLC

(57) ABSTRACT

An imaging device having a first surface on which light is incident and a second surface on an opposite side of the first surface, includes a photoelectric conversion section including semiconductors having a same conductivity type, in which an impurity concentration on the second surface side is higher than an impurity concentration on the first surface side.

24 Claims, 10 Drawing Sheets

SECOND SURFACE
(REAR SURFACE OF LIGHT RECEIVING SURFACE)

(52) U.S. Cl.
CPC ....... *H04N 5/23212* (2013.01); *H04N 5/3696* (2013.01); *H04N 5/37452* (2013.01)

(56) References Cited

U.S. PATENT DOCUMENTS

| | | |
|---|---|---|
| 2008/0210986 A1 | 9/2008 | Mauritzson |
| 2010/0207231 A1* | 8/2010 | Iwamoto ........... H01L 27/14625 257/461 |
| 2012/0080765 A1 | 4/2012 | Ku et al. |
| 2012/0188425 A1 | 7/2012 | Kita |
| 2013/0049081 A1 | 2/2013 | Moriya et al. |

OTHER PUBLICATIONS

Feb. 10, 2014 International Search Report issued in International Patent Application No. PCT/JP2013/006816.
May 26, 2015 International Preliminary Report on Patentability Issued in International Patent Application No. PCT/JP2013/006816.
Feb. 16, 2016 Office Action Issued in U.S. Appl. No. 14/646,039.
Nov. 14, 2016 Office Action Issued in U.S Appl. No. 14/646,039.
May 2, 2017 Office Action Issued in Japanese Application No. 2014-548461.
May 22, 2017 Office Action Issued in Chinese Application No. 201380070738.9.
Mar. 23, 2017 Office Action Issued in Taiwanese Patent Application No. 102142695.
Dec. 15, 2017 Office Action Issued in Taiwanese Application No. 102142695.
Jan. 9, 2018 Office Action Issued in Japanese Patent Application No. 2014-548461.
Feb. 9, 2018 Office Action issued in Chinese Application No. 201380070738.9.

* cited by examiner (LIGHT RECEIVING SURFACE)

FIRST SURFACE (LIGHT RECEIVING SURFACE)

SECOND SURFACE
(REAR SURFACE OF LIGHT RECEIVING SURFACE)

SECOND SURFACE
(REAR SURFACE OF LIGHT RECEIVING SURFACE)

IMAGING DEVICE AND IMAGING UNIT

This application is a continuation application of U.S. patent application Ser. No. 14/646,039 filed on Oct. 30, 2015, which in turn is a U.S. National Stage application claiming the benefit of prior filed International Application Number PCT/JP2013/006816, filed Nov. 20, 2013, in which the International Application claims a priority date of Nov. 22, 2012, based on prior filed Japanese Application Number 2012-256891, the entire contents on which are incorporated herein by reference.

TECHNICAL FIELD

The present invention relates to an imaging device and an imaging unit.

BACKGROUND ART

In order to realize a global shutter in a CMOS (complementary metal oxide semiconductor) image sensor, there is known an imaging apparatus in which a storage section is provided to a pixel (refer to Non-Patent Document 1, for example).

Non-Patent Document 1: Keita Yasutomi, Shinya Itoh, Shoji Kawahito, "A 2.7e-Temporal Noise 99.7% Shutter Efficiency 92 dB Dynamic Range CMOS Image Sensor with Dual Global Shutter Pixel", ITE Technical Report, Vol. 34, No. 16, pp. 25-28

DISCLOSURE

Problems to be Solved

The conventional technique leaves room to be improved in a point that a transfer omission of charge may occur in a photoelectric conversion section.

Means for Solving the Problems

An imaging device as one example of the present invention having a first surface on which light is incident and a second surface on an opposite side of the first surface, includes a photoelectric conversion section including semiconductors having a same conductivity type, in which an impurity concentration on the second surface side is higher than an impurity concentration on the first surface side.

DETAILED DESCRIPTION OF THE EMBODIMENTS

Figure 1:
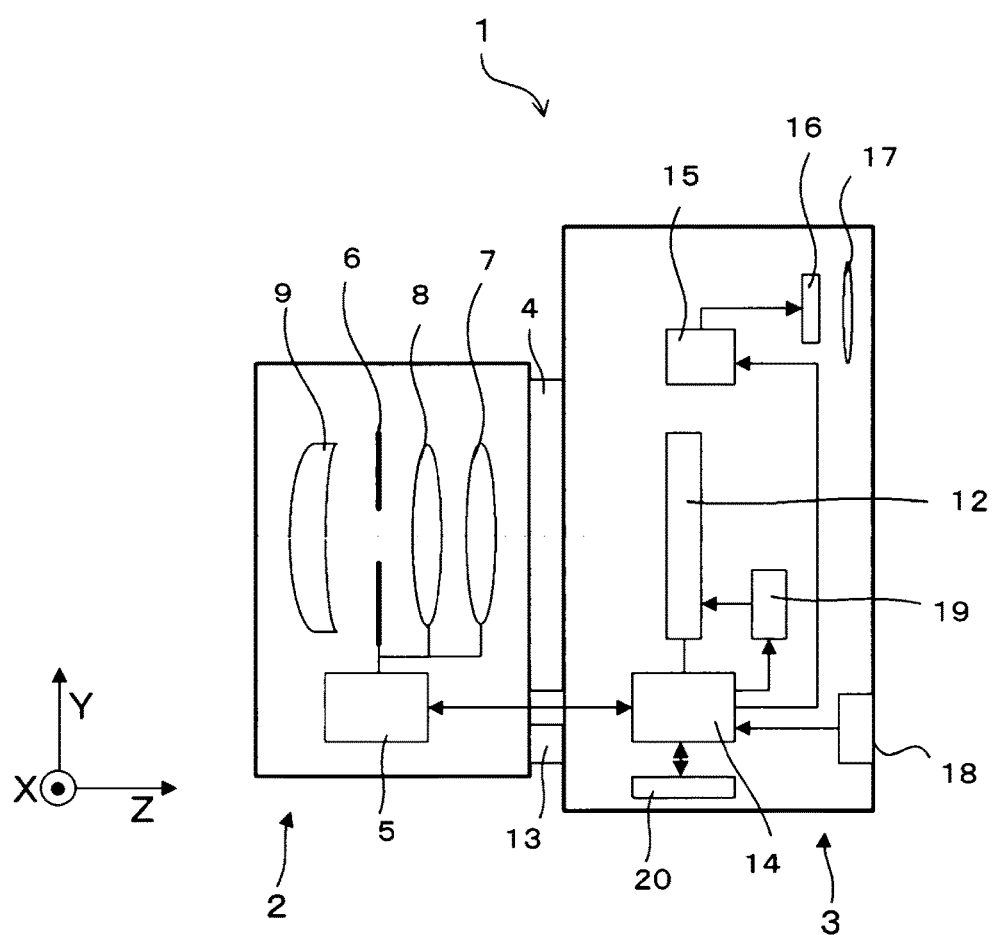
FIG. 1 is a diagram illustrating a configuration example of a digital camera.

Hereinafter, embodiments of the present invention will be described while referring to the drawings. Note that in the following description and the drawings, an X direction is defined as a horizontal direction, a Y direction is defined as a vertical direction, and a Z direction is defined as a forward and backward direction, unless otherwise noted.

<Configuration Example of Imaging Unit>

FIG. 1 is a diagram illustrating a configuration example of a digital camera as an example of an imaging unit. A digital camera 1 has an interchangeable lens 2 and a camera body 3. The interchangeable lens 2 is mounted on the camera body 3 via a mount part 4.

The interchangeable lens 2 includes a lens control part 5, a main lens 9, a zoom lens 8, a focusing lens 7, and a diaphragm 6. The lens control part 5 has a microcomputer, a memory and the like. The lens control part 5 performs a drive control of the focusing lens 7 and the diaphragm 6, a detection of an aperture state of the diaphragm 6, a position detection of the zoom lens 8 and the focusing lens 7, a transmission of lens information with respect to a body control part 14 on the camera body 3 side, which will be described later, a reception of camera information from the body control part 14, and the like.

The camera body 3 includes an imaging device 12, an imaging device driving part 19, the body control part 14, a liquid crystal display element driving circuit 15, a liquid crystal display element 16, an eyepiece lens 17, an operation member 18, and the like. Further, to the camera body 3, a memory card 20 being a nonvolatile storage medium is detachably attached.

The imaging device 12 is arranged on a planned imaging plane of the interchangeable lens 2, and captures an image of subject formed by the interchangeable lens 2. Note that the imaging device 12 in the present embodiment can receive, with the use of a pair of pixels, respective light fluxes which pass through different partial areas of a pupil of the interchangeable lens 2, and can obtain phase difference information of the subject image when performing automatic focus (AF). Note that a configuration example of the imaging device 12 will be described later.

The body control part 14 has a microcomputer, a memory and the like. The body control part 14 performs an operation control of the entire digital camera. Further, the body control part 14 and the lens control part 5 perform communication via an electric contact portion 13 of the mount part 4.

The imaging device driving part 19 generates, in accordance with an instruction from the body control part 14, an instruction signal with respect to the imaging device 12. The liquid crystal display element driving circuit 15 drives the liquid crystal display element 16 in accordance with the instruction from the body control part 14. Note that the liquid crystal display element 16 functions as an electronic viewfinder, and a photographing person can observe an image displayed on the liquid crystal display element 16, through the eyepiece lens 17.

The image of subject formed on the imaging device 12 by the interchangeable lens 2 is subjected to photoelectric conversion by the imaging device 12. Timings for storing photoelectric conversion signals and for reading the signals (frame rates) in the imaging device 12 are controlled by a control signal from the imaging device driving part 19. An output signal from the imaging device 12 is converted into digital data by a not-illustrated A/D conversion part, and sent to the body control part 14.

The body control part 14, being one example of a focusing part, calculates a defocus amount based on the output signal, corresponding to a predetermined focus detecting area, from the imaging device 12. Subsequently, the body control part 14 sends the aforementioned defocus amount to the lens control part 5. The lens control part 5 calculates a focusing lens driving amount based on the defocus amount received from the body control part 14, and based on the lens driving amount, the lens control part 5 drives the focusing lens 7 using a not-illustrated motor or the like to move the lens to a focus position.

Further, the body control part 14 generates recording image data based on a signal output from the imaging device 12 after the photographing instruction is issued. The body control part 14 stores the generated image data in the memory card 20. Further, the body control part 14 sends the generated image data to the liquid crystal display element driving circuit 15, and makes the liquid crystal display element 16 reproduce and display the image.

Note that the camera body 3 is provided with a shutter button, and a setting member 18 of the focus detecting area. The body control part 14 detects an operation signal made by the aforementioned operation member 18, and performs a control of operations (photographing processing, setting of focus detecting area, and the like) in accordance with a detection result.

<First Configuration Example of Imaging Device>

Next, a configuration example of the imaging device 12 will be described. The imaging device in the present embodiment is, for example, a solid-state imaging device of XY address type formed on a silicon substrate by using a CMOS (complementary metal oxide semiconductor) process.

Figure 2:
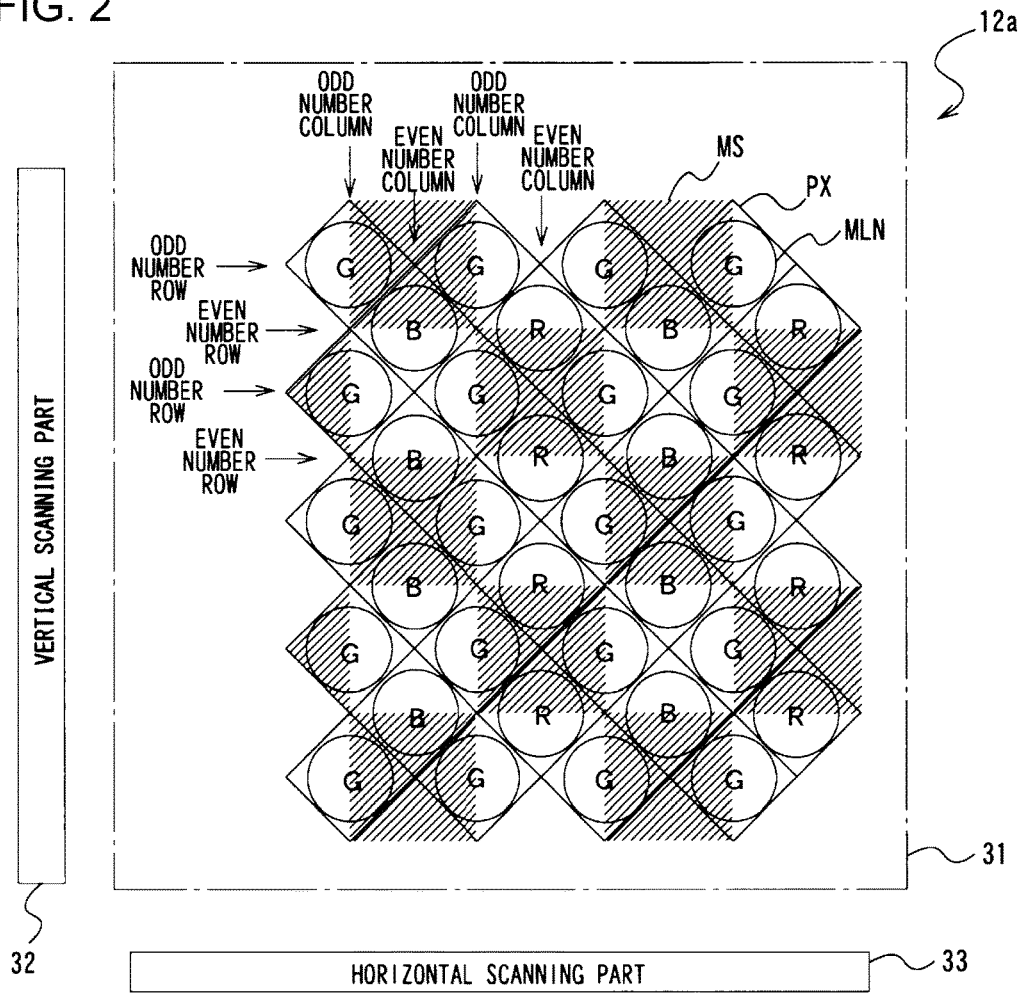
FIG. 2 is a diagram illustrating a pixel arrangement in an imaging device in a first configuration example.

FIG. 2 is a diagram illustrating a pixel arrangement in an imaging device in a first configuration example. An imaging device 12a illustrated in FIG. 2 has a pixel part 31 in which a plurality of pixels (PX) each converting incident light into an electrical signal are arrayed, a vertical scanning part 32, and a horizontal scanning part 33. Note that in the drawing, the array of pixels PX is illustrated in a simplified manner, but, it is needless to say that a larger number of pixels are arrayed on a light receiving surface of an actual imaging device.

The vertical scanning part 32 is one example of a control part, and, for example, it supplies various types of control signals to the pixel part 31 and the horizontal scanning part 33, upon receiving an instruction signal from the imaging device driving part 19. To the vertical scanning part 32, a plurality of horizontal signal lines extending in a row direction (X direction) are connected. The vertical scanning part 32 supplies the control signal to the respective pixels via the horizontal signal lines. Note that the illustration of the horizontal signal lines is omitted in FIG. 2. Note that the control signal which is supplied to the pixel PX may also be generated by the imaging device driving part 19 of the digital camera 1.

To the horizontal scanning part 33, a plurality of vertical signal lines extending in a column direction (Y direction) are connected. The horizontal scanning part 33 reads output signals of the respective pixels via the vertical signal lines. Note that the illustration of the vertical signal lines is omitted in FIG. 2.

Further, as illustrated in FIG. 2, the pixel PX in the pixel part 31 has a square shape, and is arranged in a state where each side thereof is rotated by 45 degrees with respect to the row direction and the column direction. Further, the respective pixels are densely arrayed so that respective sides of each pixel are brought into contact with neighboring pixels. Therefore, in the pixel part 31, pixels on an odd number row and pixels on an even number row are arranged by being displaced by half pitch, and pixels on an odd number column and pixels on an even number column are arranged by being displaced by half pitch.

A half area of the pixel PX is covered by a lightproof film, for example, so that the pixel PX shields a light flux which passes through a partial area of a pupil of an optical system. Further, on an opening of the pixel PX which is not covered by the lightproof film, a photoelectric conversion section is arranged. In the drawing, the area covered by the lightproof film (pupil-division lightproof section MS) is illustrated by hatching.

Further, on a front surface of the pixel PX, a microlens MLN and an optical filter (color filter) are arranged. Further, on a light receiving surface of the imaging device, an infrared cut filter (not illustrated) which inhibits a passage of infrared light is arranged at a position in front of the microlens MLN and the optical filter (on incident side of light). The color filters of the pixels PX have different spectral sensitivities according to pixel positions. For this reason, the pixel PX outputs an electrical signal corresponding to each color, through a color separation in the color filter. Note that in the drawing, a color of the color filter corresponding to the pixel PX is indicated by a symbol.

If attention is focused on the row direction (X direction) of the pixel part 31, on the odd number rows in the pixel part 31, G pixels each receiving light of green (G) component are arranged along the X direction. On the even number rows in the pixel part 31, B pixels each receiving light of blue (B) component and R pixels each receiving light of red (R) component are alternately arranged along the X direction.

Further, if attention is focused on the column direction (Y direction) of the pixel part 31, although the G pixels are arranged along the Y direction on the odd number columns in the pixel part 31, on the even number columns in the pixel part 31, the column on which the B pixels are arranged along the Y direction and the column on which the R pixels are arranged along the Y direction, are alternately arrayed.

Regarding the G pixels, the pixel whose left half is opened and the pixel whose right half is opened, are alternately arranged in each of the row direction (X direction) and the column direction (Y direction). Further, regarding the B pixels and the R pixels, the pixel whose upper half is opened and the pixel whose lower half is opened, are alternately arranged in the column direction (Y direction). Note that in the row direction (X direction), the B pixels and the R pixels are arranged in a manner that the position of the opening of the B pixel and the position of the opening of the R pixel become opposite to each other, on the same even number row.

By the above-described arrangement, in the row direction (X direction), the G pixel whose left half is opened (one example of first pixel) and the G pixel whose right half is opened (one example of second pixel) make a set in a bilaterally symmetric state, and the sets are arranged one by one. Specifically, on the row on which the G pixels are arranged, a photoelectric conversion section of the first pixel, a lightproof section MS of the first pixel, a lightproof section MS of the second pixel, and a photoelectric conversion section of the second pixel are arranged in this order, when seen from the left side in the X direction. Further, in the X direction, a photoelectric conversion section of the G pixel whose left half is opened, which is different from the first pixel (one example of fifth pixel), is arranged at a position adjacent to the photoelectric conversion section of the second pixel. Note that a configuration of the first pixel and a configuration of the fifth pixel are the same.

Therefore, an image of a left half of an exit pupil and an image of a right half of the exit pupil can be obtained by the pair of G pixels arranged to face each other in the horizontal direction (the second pixel and the fifth pixel, in the aforementioned example). Specifically, phase difference information in the horizontal direction of a subject image used in the phase difference AF can be obtained by the pair of G pixels.

Further, in the column direction (Y direction), the B pixel whose upper half is opened (one example of third pixel) and the B pixel whose lower half is opened (one example of fourth pixel) make a set in a vertically symmetric state, and the sets are arranged one by one. Specifically, on the column on which the B pixels are arranged, a photoelectric conversion section of the third pixel, a lightproof section MS of the third pixel, a lightproof section MS of the fourth pixel, and a photoelectric conversion section of the fourth pixel are arranged in this order, when seen from the upper side in the Y direction. Further, in the Y direction, a photoelectric conversion section of the B pixel whose upper half is opened, which is different from the third pixel (one example of sixth pixel), is arranged at a position adjacent to the photoelectric conversion section of the fourth pixel.

In like manner, in the column direction (Y direction), the R pixel whose upper half is opened (one example of third pixel) and the R pixel whose lower half is opened (one example of fourth pixel) make a set in a vertically symmetric state, and the sets are arranged one by one. Specifically, on the column on which the R pixels are arranged, a photoelectric conversion section of the third pixel, a lightproof section MS of the third pixel, a lightproof section MS of the fourth pixel, and a photoelectric conversion section of the fourth pixel are arranged in this order, when seen from the upper side in the Y direction. Further, in the Y direction, a photoelectric conversion section of the R pixel whose upper half is opened, which is different from the third pixel (one example of sixth pixel), is arranged at a position adjacent to the photoelectric conversion section of the fourth pixel. Note that in each of the examples of the B pixels and the R pixels, a configuration of the third pixel and a configuration of the sixth pixel are the same.

Therefore, an image of a lower half of the exit pupil and an image of an upper half of the exit pupil can be obtained by the pair of B pixels or the pair of R pixels arranged to face each other in the vertical direction (the fourth pixel and the sixth pixel, in the aforementioned example). Specifically, phase difference information in the vertical direction of the subject image used in the phase difference AF can be obtained by the pair of B pixels or the pair of R pixels. As described above, the imaging device 12a of the first configuration example can also be considered as an imaging device in which the focus detecting pixels are arranged on the whole surface of the light receiving surface.

Note that in the pixel part 31, a pair of G pixels on the odd number row, and a pair of B pixels or a pair of R pixels on the even number column are arranged so that four openings (photoelectric conversion sections) thereof form a square. In like manner, in the pixel part 31, a pair of G pixels on the odd number row, and a pair of B pixels or a pair of R pixels on the even number column are arranged so that four lightproof sections thereof form a square. Note that when looking at the pixel part 31 as a whole, the square-shaped openings each formed by four pixels and the square-shaped lightproof sections each formed by four pixels are arrayed so as to form a checkered pattern. Further, in the pixel part 31, the lightproof sections each formed by four pixels may also be integrally formed.

Here, focus detection processing based on phase difference information obtained from the imaging device 12a, will be described. Hereinafter, description will be made by citing the G pixel whose left half is opened and the G pixel whose right half is opened, as an example, but, the focus detection using the R pixels and the B pixels is also conducted based on a similar principle.

Figure 3:
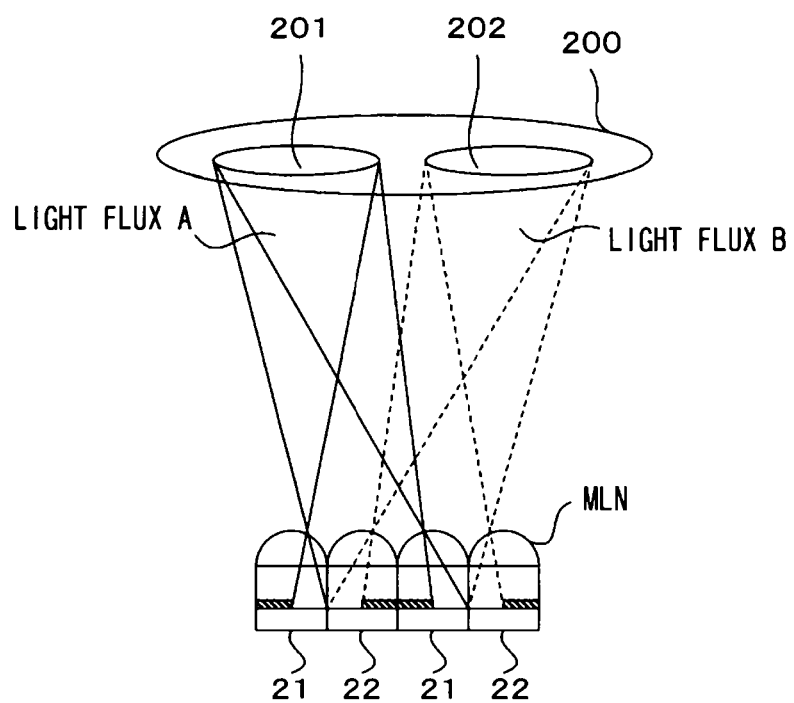
FIG. 3 is an explanatory diagram of a focus detection method conducted by a pupil-division phase difference method.

As illustrated in FIG. 3, a light flux A which passes through a first area 201 of an exit pupil 200 of the interchangeable lens 2 is incident on G pixels 21 in each of which a right half is opened, and a light flux B which passes through a second area 202 of the exit pupil 200 is incident on G pixels 22 in each of which a left half is opened.

An in-focus state is a state where a sharp image is formed on the imaging device 12a, so that a pair of images formed by the pupil-divided light fluxes match on the imaging device 12a, as described above.

On the other hand, an out-of-focus state is a state where a sharp image is formed at a position in front of the imaging device 12a, or at a rear side of the imaging device 12a, so that the pair of images formed by the pupil-divided light fluxes do not match on the imaging device 12a. In this case, signal waveforms obtained from the G pixels 21 and the G pixels 22 have mutually different positional relationships (an image deviation direction and an image deviation amount), in accordance with a deviation from the in-focus state (defocus amount).

Accordingly, the body control part 14 of the digital camera 1 is only required to calculate the defocus amount based on the positional relationships of the signal waveforms obtained from the G pixels 21 and the G pixels 22. The calculated defocus amount is transmitted to the lens control part 5 as camera information. Further, when the lens control part 5 makes the focusing lens 7 perform forward/backward movement in an optical axis direction based on the camera information, a focal position of the interchangeable lens 2 is adjusted so that a sharp image is formed on the imaging device 12a.

Next, image signal generation processing for generating a color image signal based on an output signal from the imaging device 12a, will be described while referring to FIG. 4A to FIG. 4E.

Figure 4:
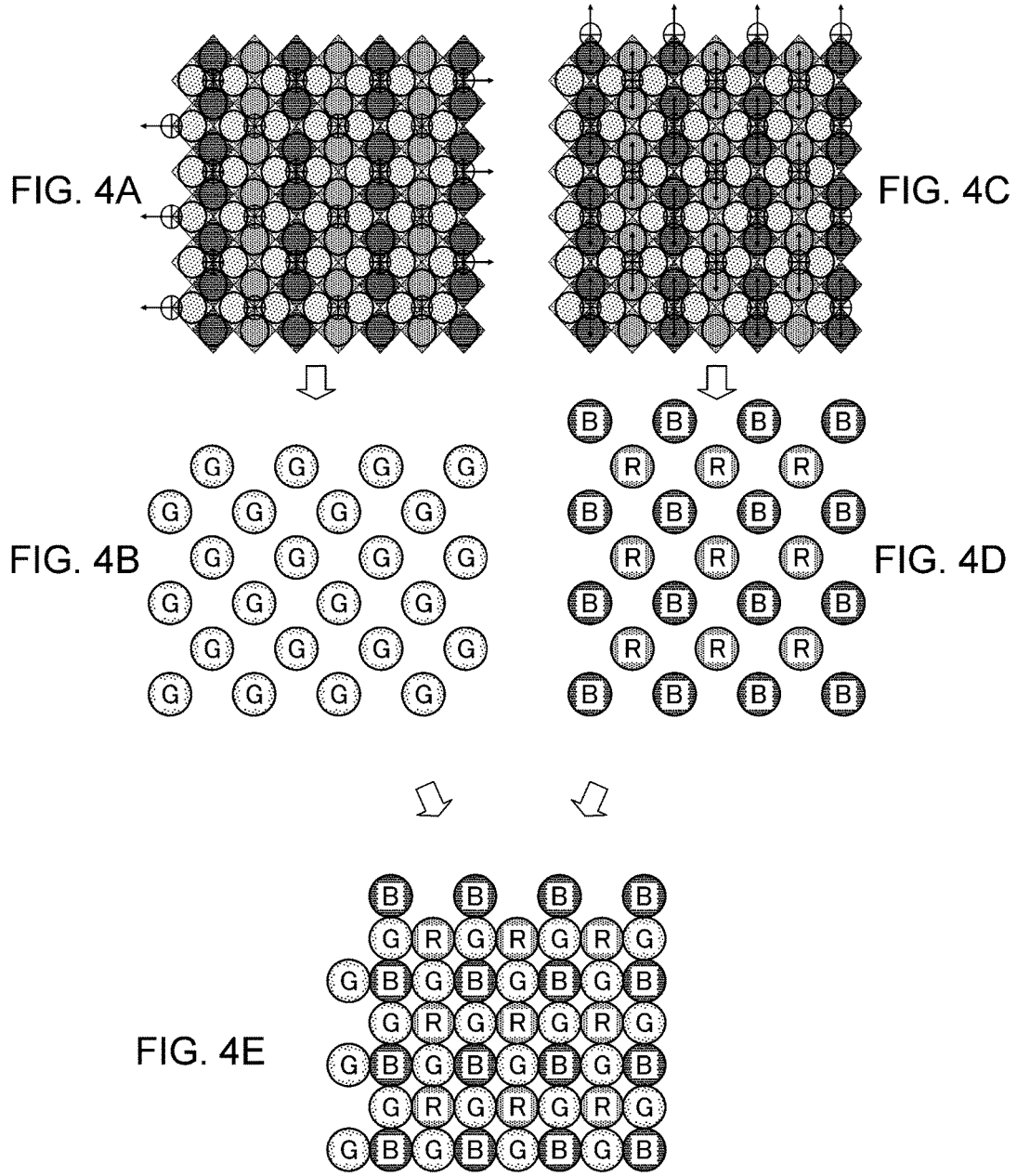
FIG. 4A to FIG. 4E are explanatory diagrams of image signal generation processing.

In the image signal generation processing, the vertical scanning part 32 of the imaging device 12a reads a pair of G pixels whose photoelectric conversion sections are adjacent in the X direction (the second pixel and the fifth pixel, in the above-described example) by performing horizontal addition on the pixels, to thereby generate a G image signal. FIG. 4A illustrates a state where the horizontal addition is performed on the G pixels, and FIG. 4B illustrates sampling positions of the G image signals generated through the horizontal addition.

Further, the vertical scanning part 32 reads a pair of B pixels whose photoelectric conversion sections are adjacent in the Y direction (the fourth pixel and the sixth pixel, in the above-described example) by performing vertical addition on the pixels, to thereby generate a B image signal. In like manner, the vertical scanning part 32 reads a pair of R pixels whose photoelectric conversion sections are adjacent in the Y direction (the fourth pixel and the sixth pixel, in the above-described example) by performing vertical addition on the pixels, to thereby generate an R image signal. FIG. 4C illustrates a state where the vertical addition is performed on the B pixels and the R pixels, and FIG. 4D illustrates sampling positions of the B image signals and the R image signals generated through the vertical addition.

FIG. 4E illustrates an image as a result of synthesizing the G image signals generated through the horizontal addition, and the B image signals and the R image signals generated through the vertical addition. The body control part 14 of the digital camera 1 can obtain an image in Bayer array, by synthesizing the G image signals, the B image signals, and the R image signals. Note that the image in FIG. 4E has a pixel pitch which is about 1.4 times ($\sqrt{2}$ times) a pixel pitch before performing the addition, and has a number of pixels which is half a number of pixels before performing the addition.

Further, the body control part 14 performs color interpolation processing on the above-described image in Bayer array (FIG. 4E), to thereby generate image signals of lacked color components. The color interpolation processing in the Bayer array is publicly-known, so that detailed explanation thereof will be omitted. As a result of such color interpolation processing, color image signals (RGB) are obtained. The body control part 14 generates, for example, a recording image file by using the color image signals, and records the file in the memory card 20.

Figure 5:
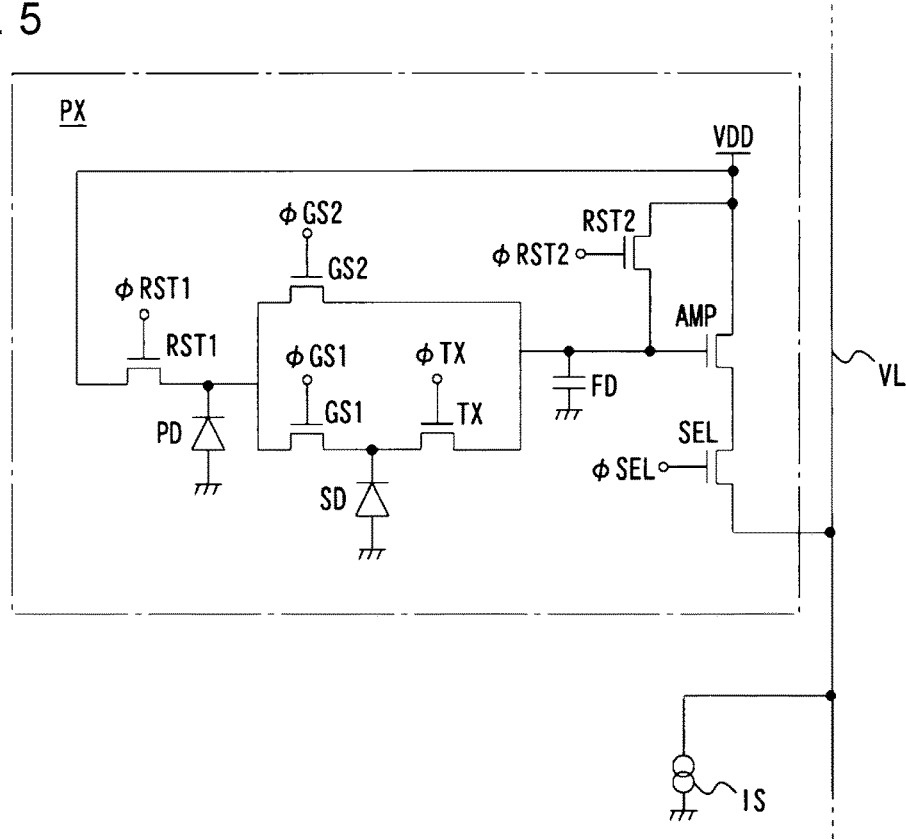
FIG. 5 is a circuit diagram of an example of a pixel PX.

Subsequently, a configuration of each pixel PX in the first configuration example will be described in detail. FIG. 5 is a circuit diagram of an example of the pixel PX.

The pixel PX has a photodiode PD, a first reset transistor RST1, a first global switch transistor GS1, a storage diode SD, a transfer transistor TX, a second global switch transistor GS2, a second reset transistor RST2, an amplifying transistor AMP, a selection transistor SEL, and a floating diffusion part FD.

The photodiode PD is an example of a photoelectric conversion section, and generates a signal charge through photoelectric conversion in accordance with a light intensity of incident light.

The first reset transistor RST1 has a source connected to the photodiode PD, and a drain connected to a power supply voltage VDD. For example, the first reset transistor RST1 is turned on during a period of time in which a signal $\phi$RST1 applied to a gate thereof is at a high level, to reset a charge in the photodiode PD.

The first global switch transistor GS1 has a source connected to the photodiode PD, and a drain connected to the storage diode SD. For example, the first global switch transistor GS1 is turned on during a period of time in which a signal $\phi$GS1 applied to a gate thereof is at a high level, to transfer the signal charge stored in the photodiode PD to the storage diode SD.

The storage diode SD is an example of a storage section, and has a potential well for storing the charge transferred from the photodiode PD. The storage diode SD is formed by a MOS structure, for example, and the storage diode SD is designed to be able to store charges whose amount is larger than an amount of charges stored in the photodiode PD.

The transfer transistor TX has a source connected to the storage diode SD, and a drain connected to the floating diffusion part FD. For example, the transfer transistor TX is turned on during a period of time in which a signal $\phi$TX applied to a gate thereof is at a high level, to transfer the signal charge stored in the storage diode SD to the floating diffusion part FD.

The second global switch transistor GS2 has a source connected to the photodiode PD, and a drain connected to the floating diffusion part FD. For example, the second global switch transistor GS2 is turned on during a period of time in which a signal $\phi$GS2 applied to a gate thereof is at a high level, to transfer the signal charge stored in the photodiode PD to the floating diffusion part FD.

The floating diffusion part FD corresponds to a region in which a parasitic capacitor storing the charge transferred from the photodiode PD or the storage diode SD is formed. The floating diffusion part FD corresponds to, for example, a diffusion region formed by introducing impurities into a semiconductor substrate.

The second reset transistor RST2 has a source connected to a gate of the amplifying transistor AMP, and a drain connected to the power supply voltage VDD. For example, the second reset transistor RST2 is turned on during a period of time in which a signal $\phi$RST2 applied to a gate thereof is at a high level, to reset the charge in the floating diffusion part FD.

The amplifying transistor AMP has a drain and a gate connected to the power supply voltage VDD and the floating diffusion part FD, respectively, and a source connected to a drain of the selection transistor SEL, and forms a source follower circuit in which a constant current source IS connected to the vertical signal line VL is set to a load. The amplifying transistor AMP outputs a read current via the selection transistor SEL, in accordance with a voltage value of the floating diffusion part FD.

Further, the selection transistor SEL is turned on during a period of time in which a signal $\phi$SEL applied to a gate thereof is at a high level, to connect the source of the amplifying transistor AMP to the vertical signal line VL.

Here, components of each of the above-described first pixel to sixth pixel are the same. Accordingly, each of the first pixel to the sixth pixel basically has the photodiode PD, the first reset transistor RST1, the first global switch transistor GS1, the storage diode SD, the transfer transistor TX, the second global switch transistor GS2, the second reset transistor RST2, the amplifying transistor AMP, the selection transistor SEL, and the floating diffusion part FD. Further, although FIG. 5 illustrates only the circuit configuration of one pixel, for example, the second reset transistor RST2, the amplifying transistor AMP, and the selection transistor SEL may also be shared by a plurality of pixels.

Figure 6:
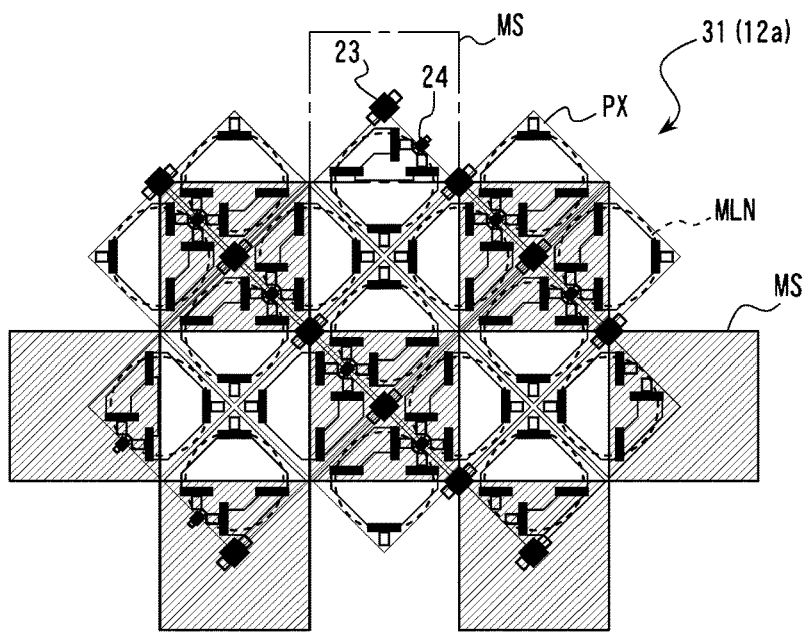
FIG. 6 is an enlarged plan view of a pixel array in the first configuration example.
Figure 7:
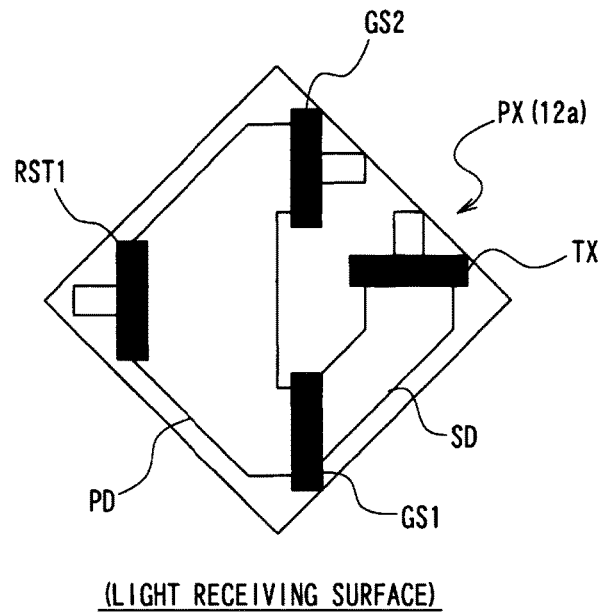
FIG. 7 is an enlarged plan view of an example of the pixel PX.

Further, FIG. 6 is an enlarged plan view of the pixel array of the pixel part 31 illustrated in FIG. 2. FIG. 7 is an enlarged plan view of an example of the pixel PX.

On an opening of the pixel PX, on the light receiving surface side of the imaging device 12a, there are arranged the photodiode PD formed to have an approximately trapezoidal shape, and the first reset transistor RST1. On the lightproof section of the pixel PX, there are arranged the first global switch transistor GS1, the storage diode SD, the transfer transistor TX, and the second global switch transistor GS2. Note that a reference numeral 23 in FIG. 6 indicates a circuit in which the amplifying transistor AMP and the selection transistor SEL shared by four pixels are integrated. Note that a reference numeral 24 in FIG. 6 indicates the second reset transistor RST2 shared by two pixels. Further, in FIG. 6 and FIG. 7, an area of the photodiode PD on the light receiving surface is set to be larger than an area of the storage diode SD.

As illustrated in FIG. 6, each of the R pixel, the G pixel, and the B pixel has the same circuit configuration. The circuits of the G pixels adjacent in the row direction (X direction) are arranged in a bilaterally symmetric state on the light receiving surface. Further, the circuits of the B pixels and the circuits of the R pixels adjacent in the column direction (Y direction) are respectively arranged in a vertically symmetric state on the light receiving surface.

Figure 8:
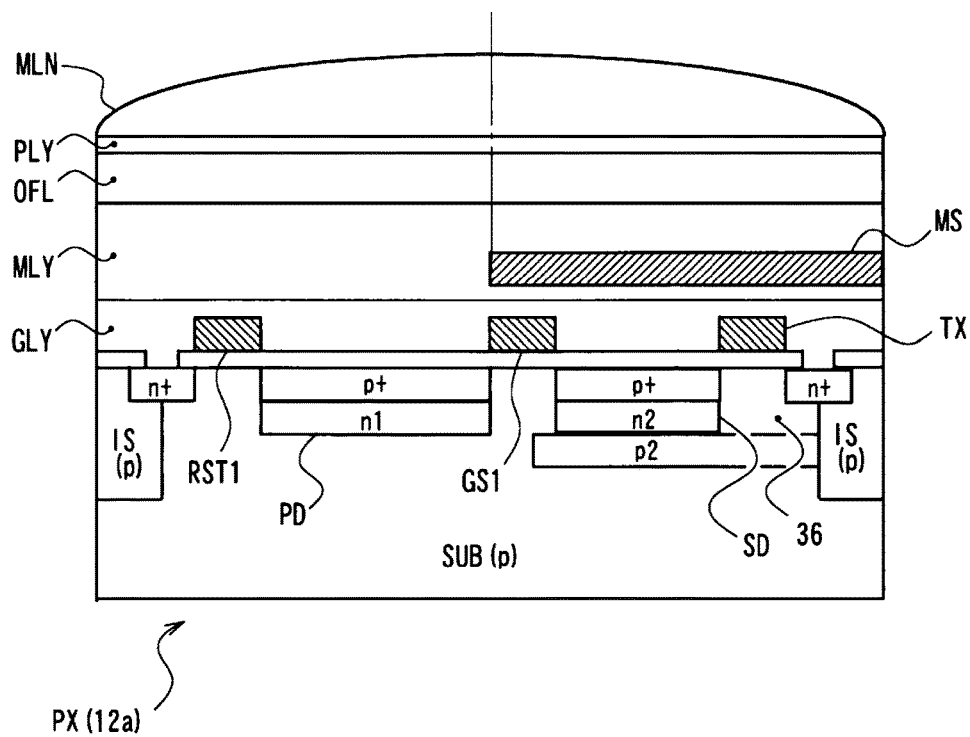
FIG. 8 is a sectional view of the pixel PX in the first configuration example.

Further, FIG. 8 is a sectional view of the pixel PX in the first configuration example. Note that in FIG. 8, illustration of wiring and the like is omitted. For example, the photodiode PD has an n-type semiconductor region n1 formed on a light receiving surface side of a p-type semiconductor substrate SUB (upper side in FIG. 8). Further, the storage diode SD has an n-type semiconductor region n2 formed on the light receiving surface side of the p-type semiconductor substrate SUB.

Further, on a lower layer of the semiconductor region n2 of the storage diode SD, a p-type shield layer (p2) is formed by being stacked on the layer. The shield layer is formed so as to cover the entire region of the semiconductor region n2, and is formed so as to be brought into contact with a later-described separating section IS according to need. Further, the first global switch transistor GS1 is formed between the photodiode PD and the storage diode SD.

Further, an impurity concentration of the semiconductor region n1 of the photodiode PD and an impurity concentration of the semiconductor region n2 of the storage diode SD are different to each other. For example, the impurity concentrations of the regions n1 and n2 are respectively set so that a potential of the storage diode SD is positioned between a potential of the photodiode PD and a potential of the floating diffusion part FD, when the first global switch transistor GS1 is at a low level.

Further, the separating section IS formed in the semiconductor substrate SUB is, for example, a p-type well for insulating and separating pixels which are adjacent to each other. Note that at a position among the storage diode SD, the separating section IS, and the shield layer (p2), a p-type region 36 is formed. Further, in a gate layer GLY provided on the semiconductor substrate SUB, there are formed the first reset transistor RST1, the first global switch transistor GS1, the transfer transistor TX, a gate electrode of the second global switch transistor GS2 which is not illustrated in FIG. 8, and the like. Note that the conductivity type of the semiconductor described in the first configuration example is only one example.

Further, on the gate layer GLY of the semiconductor substrate SUB, a wiring layer MLY including the lightproof section MS is provided. For example, the lightproof section MS is formed by a metal film or the like. The lightproof section MS is arranged so as to cover a region in which the first global switch transistor GS1, the storage diode SD, the transfer transistor TX, and the second global switch transistor GS2 are arranged. Specifically, on the photodiode PD, there is formed an opening in which the lightproof section MS does not exist.

Here, in the pixel PX, the lightproof section MS is formed by a single member, and has a function as a pupil-division lightproof section and a function as a lightproof section for storage section which shields incident light with respect to the storage diode SD. Note that the lightproof section MS may be formed at a place other than the lowermost layer of the wiring layer MLY, or it may also be formed at a place where a wiring is provided. For example, the wiring may be formed in a layer different from the layer in which the lightproof section MS is provided, or it may also be formed in a layer same as the layer in which the lightproof section MS is provided.

Further, on the wiring layer MLY, an optical filter OFL which functions as a color filter is arranged. On the optical filter OFL, a flat layer PLY is formed. Further, on the flat layer PLY, the microlens MLN is arranged.

Further, in each of the pixels including the first pixel to the sixth pixel described above, a center of optical axis of the microlens MLN is positioned by being aligned with a boundary between the lightproof section MS and the opening (photoelectric conversion section), in order to perform the pupil division.

Further, description will be made on operation modes when reading a signal from each pixel PX in the first configuration example. The above-described pixel PX has the two global switch transistors GS1 and GS2, so that it can be driven by two operation modes of a single shutter and a dual shutter.

In the operation of single shutter, the global switch transistors GS2 are set to be turned off all the time. First, at a beginning of a frame, a signal charge is transferred from the photodiode PD to the storage diode SD via the global switch transistor GS1, in each of all of the pixels at the same time, as initial-stage charge transfer. This makes it possible to realize a global electronic shutter function. Next, in each of all of the pixels, the first reset transistor RST1 is turned on, to set the photodiode PD to be in a reset state until when a storage of the next frame is started. By the above-described adjustment of reset time, the imaging device 12a can freely set an exposure time (shutter speed).

Further, a signal reading operation from each pixel PX is conducted for each row selected by the vertical scanning part 32. When the vertical scanning part 32 sets a signal φSEL(i) for i-th row to a high level, each pixel PX on the i-th row is selected. Further, when the vertical scanning part 32 sets a signal φRST1(i) for the i-th row to a high level, the floating diffusion part FD of each pixel PX on the i-th row is reset. A reset voltage including the reset noise is read, as a reference voltage, from each pixel PX on the i-th row. Thereafter, when the vertical scanning part 32 sets a signal φTX(i) for the i-th row to a high level, the charge in the storage diode SD is transferred to the floating diffusion part FD by the transfer transistor TX in each pixel PX on the i-th row. This makes it possible to read the changed voltage as a signal voltage. Further, a difference between the above-described reference voltage and the signal voltage is read, as an output signal of each pixel PX, by a CDS circuit (not illustrated) provided to a column of the horizontal scanning part 33. Consequently, it is possible to cancel the reset noise and a fixed pattern noise from the output signal of each pixel PX.

Meanwhile, in the operation of dual shutter, signals stored in the storage diodes SD and signals stored in the floating diffusion parts FD are used to obtain two images, within an imaging period of one frame.

In the operation of dual shutter, the photodiode PD is reset after the initial-stage charge transfer, and then a charge is stored again in the photodiode PD. The second signal charge stored after the reset is transferred to the floating diffusion part FD via the global switch transistor GS2. The storage of the second signal charge described above is also conducted in each of all of the pixels at the same time, thereby realizing the global electronic shutter. The above-described second signal charge is held in the floating diffusion part FD until when the row selection is performed, and when the row selection is performed, the charge is read from each pixel PX. Further, it is only required that the floating diffusion part FD is once reset, and then the charge in the storage diode SD is read by being transferred to the floating diffusion part FD by the transfer transistor TX. In the operation of dual shutter, a mere double sampling with no correlation is performed, in which although the fixed pattern noise is canceled, the reset noise is not canceled.

By using the two images obtained by the operation of dual shutter described above, it is possible to realize, for example, widening of dynamic range, a motion detection based on a difference image, a continuous high-speed capturing of two pieces of images, and the like.

As an example, if the widening of dynamic range is performed, long-time exposure signals are first stored in the storage diodes SD, and next, short-time exposure signals are stored in the floating diffusion parts FD. Further, it is only required to assign the long-time exposure signals to a low-illuminance region in an image, and to assign the short-time exposure signals to a high-illuminance region in the image, to synthesize the images. The long-time exposure signal has a low noise, and in addition to that, since a shot noise is dominant on the high-illuminance side, a reset noise included in the short-time exposure signal can be ignored. Accordingly, by synthesizing the images obtained by the operation of dual shutter, it is possible to effectively widen the dynamic range.

Further, in the operation of dual shutter, it is possible to remarkably shorten a difference in storage time between two pieces of images. For example, if the above-described widening of dynamic range is performed, it becomes easy to suppress an image strain and a motion blur when performing the synthesis.

Hereinafter, operations and effects of the imaging device 12a in the first configuration example will be described.

(1) In the imaging device 12a in the first configuration example, the pairs of pixels, each pair obtaining a pair of images through pupil division, are arranged on the entire light receiving surface. Accordingly, it becomes possible to perform the focus detection based on the phase difference AF, in the entire light receiving surface of the imaging device 12a. Further, the respective pixels of the imaging device 12a function as both imaging pixels and focus detecting pixels, so that the number of focus detecting pixels becomes very large, when compared to a case where the focus detecting pixels are arranged on a part of the light receiving surface, resulting in that the focus detection accuracy in the phase difference AF is improved.

(2) The imaging device 12a in the first configuration example can obtain the phase difference information in the horizontal direction of the subject image, from the pair of G pixels arranged to face each other in the horizontal direction. Further, the imaging device 12a can obtain the phase difference information in the vertical direction of the subject image, from the pair of B pixels or the pair of R pixels arranged to face each other in the vertical direction. Accordingly, the imaging device 12a can deal with both of the phase difference AF in the horizontal direction and the phase difference AF in the vertical direction, resulting in that the focus detection accuracy in the phase difference AF is improved.

(3) The imaging device 12a in the first configuration example can obtain the phase difference information of the subject image by any of the R pixels, the G pixels, and the B pixels. Accordingly, the lowering of detection accuracy of the phase difference information due to a color of the subject, becomes difficult to occur in the imaging device 12a. Specifically, the number of subjects or scenes on which the imaging device 12a has trouble performing processing, when the phase difference AF is conducted, is reduced, resulting in that the focus detection accuracy in the phase difference AF is improved.

(4) The imaging device 12a in the first configuration example can obtain the image having the Bayer array structure through the horizontal addition of the G pixels, and the vertical addition of the B pixels and the R pixels (refer to FIG. 4A to FIG. 4E). Accordingly, the imaging device 12a can obtain a recording color image without performing special pixel interpolation such as one performed when the focus detecting pixels are arranged on a part of the light receiving surface.

(5) The imaging device 12a in the first configuration example has the respective pixels each including the photodiode PD, and the storage diode SD. By transferring the signal charge from the photodiode PD to the storage diode SD in each of all of the pixels at the same time, the imaging device 12a can perform the imaging using the global electronic shutter. For example, in the imaging using the global electronic shutter, a simultaneity is realized in all of the pixels, so that an image with small focal plane distortion can be obtained. Further, when the global electronic shutter is used at a time of performing a flash photographing using a lighting device, even if a shutter speed is high, it becomes easy to perform synchronization between the shutter speed and the light emission in the light device (high-speed flash synchronization).

<Second Configuration Example of Imaging Device>

An imaging device 12b in a second configuration example is a rear surface irradiation type imaging device having a pixel array same as that of the first configuration example, and in which the gate layer GLY and the wiring layer MLY are formed on a rear surface side of a light receiving surface thereof. The imaging device 12b in the second configuration example corresponds to a modified example of the imaging device 12a in the first configuration example, in which a part, of the second configuration example, common to that of the first configuration example is denoted by the same reference numeral, and overlapped explanation thereof will be omitted.

Figure 9:
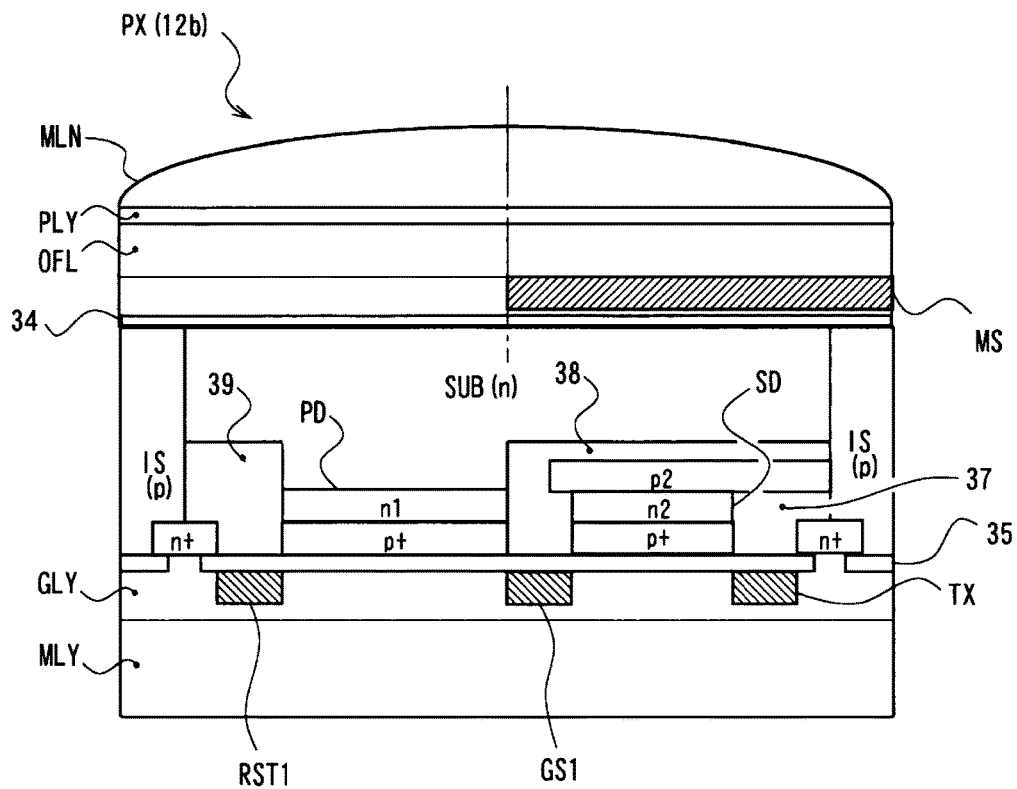
FIG. 9 is a sectional view of a pixel PX in a second configuration example.
Figure 10:
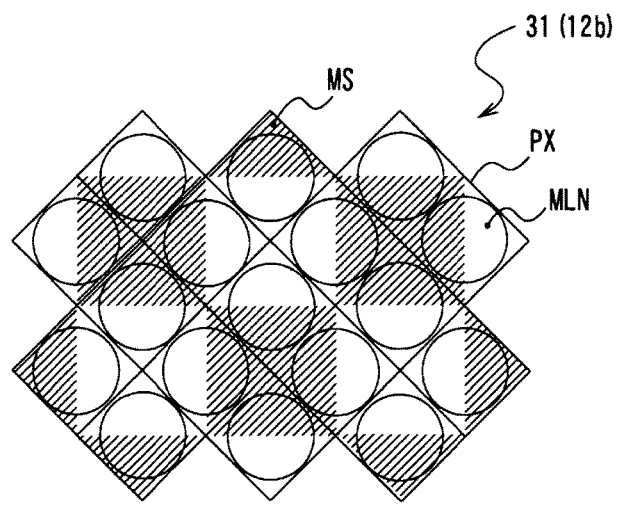
FIG. 10 is a diagram illustrating an example of a pixel array on a light receiving surface side in the second configuration example.
Figure 11:
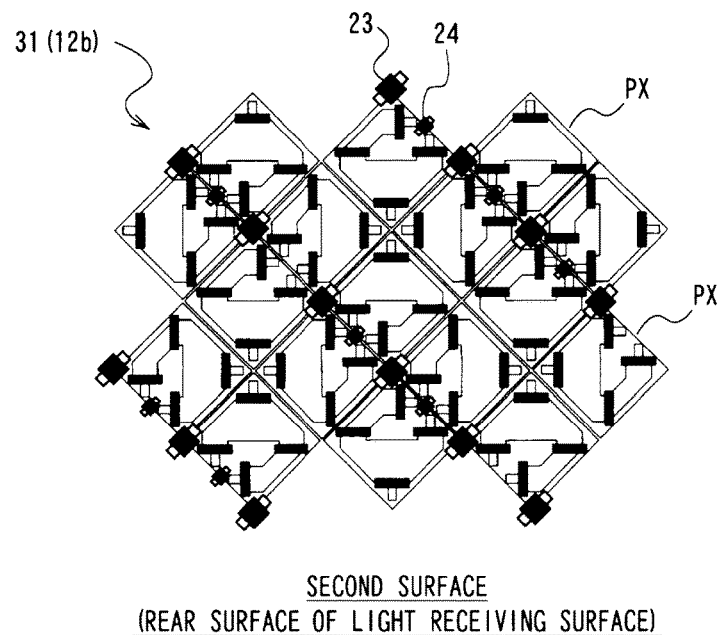
FIG. 11 is a diagram illustrating an example of a pixel array on a rear surface side of the light receiving surface in the second configuration example.

FIG. 9 is a sectional view of the pixel PX in the second configuration example. FIG. 9 corresponds to FIG. 8 in the first configuration example. Further, FIG. 10 is a diagram illustrating an example of a pixel array on the light receiving surface (first surface) side in the second configuration example. Further, FIG. 11 is a diagram illustrating an example of a pixel array on the side of the rear surface of the light receiving surface (second surface) in the second configuration example.

On each pixel PX on the first surface of the imaging device 12b, the microlens MLN, the color filter (optical filter OFL), and the lightproof section MS formed of the lightproof film are respectively arranged. Further, on the light receiving surface of each pixel PX in the imaging device 12b, visible light in accordance with the spectral sensitivity of the color filter, out of light passed through the infrared cut filter (not illustrated) which is arranged at a position in front of the microlens MLN, is incident. Note that in the second configuration example, the arrangement pattern of the color filter and the lightproof section on the light receiving surface is similar to that of the first configuration example.

Specifically, the lightproof section MS in the second configuration example is arranged so as to shield a light flux which passes through a half part of the pupil of the optical system, and on the first surface of the imaging device 12b, there are formed openings in each of which the lightproof section MS does not exist. The lightproof section MS is arranged so as to cover the region in which the first global switch transistor GS1, the storage diode SD, the transfer transistor TX, and the second global switch transistor GS2 are arranged, for example. Note that the lightproof section MS blocks the incident of light on the adjacent pixel, so that a crosstalk of signals can be prevented.

Further, on the lightproof section MS, the optical filter OFL which functions as the color filter is arranged. On the optical filter OFL, the flat layer PLY is formed. Further, on the flat layer PLY, the microlens MLN is arranged. The center of optical axis of the microlens MLN of each pixel is positioned so as to be aligned with a boundary between the lightproof section MS and the opening (photoelectric conversion section), in order to perform the pupil division.

Meanwhile, on the second surface of the imaging device 12b, the gate layer GLY and the wiring layer MLY are formed, as described above. Further, on the second surface of the imaging device 12b, the photodiode PD formed to have an approximately trapezoidal shape, the first reset transistor RST1, the first global switch transistor GS1, the storage diode SD, the transfer transistor TX, and the second global switch transistor GS2 are arranged on each pixel PX. Further, on the second surface of the imaging device 12b, circuits 23 and 24 shared by pixels are also arranged.

Also in the second configuration example, each of the R pixel, the G pixel, and the B pixel has the same circuit configuration. The circuits of the G pixels adjacent in the row direction (X direction) are arranged in a bilaterally symmetric state on the second surface. Further, the circuits of the B pixels and the circuits of the R pixels adjacent in the column direction (Y direction) are respectively arranged in a vertically symmetric state on the second surface. Further, also in the second configuration example, an area of the photodiode PD on the second surface is set to be larger than an area of the storage diode SD.

Further, as illustrated in FIG. 9, an n-type semiconductor substrate SUB is used as the imaging device 12b in the second configuration example. On a first surface of the semiconductor substrate SUB, a p-type semiconductor layer 34 (one example of first semiconductor section) is formed. For example, the p-type semiconductor layer 34 is formed so as to cover the separating section IS and the first surface side of the pixel PX. Further, on the p-type semiconductor layer 34, the lightproof section MS, the optical filter OFL, the flat layer PLY, and the microlens MLN are respectively formed.

Further, the photodiode PD has the n-type semiconductor region n1 formed on a second surface side of the n-type semiconductor substrate SUB (lower side in FIG. 9). The semiconductor region n1 illustrated in FIG. 9 is brought into contact with the n-type semiconductor substrate SUB.

Further, the storage diode SD has the n-type semiconductor region n2 formed on the second surface side of the n-type semiconductor substrate SUB. Further, on an upper layer of the semiconductor region n2 of the storage diode SD, the p-type shield layer (p2) is formed by being stacked on the layer. The shield layer, being one example of an insulation section, is formed so as to cover the entire region of the semiconductor region n2, and is formed so as to be brought into contact with the later-described separating section IS according to need. Further, the first global switch transistor GS1 as one example of a transfer gate section is formed between the photodiode PD and the storage diode SD.

Further, on the second surface of the semiconductor substrate SUB, p-type semiconductor layers p+(one example of second semiconductor section) corresponding to the semiconductor regions n1 and n2 are respectively formed. Further, on the second surface of the semiconductor substrate SUB, a p-type region 35 is formed between the substrate and the gate layer GLY.

In each pixel PX in the second configuration example, the n-type semiconductor substrate SUB receives, from its first surface side, a part of light flux being subjected to the pupil division by the lightproof section MS, and generates a charge through photoelectric conversion. In the imaging device 12b in the second configuration example, light with a long wavelength is cut by the infrared cut filter, and thus is not incident on the semiconductor substrate SUB. Further, if the semiconductor substrate SUB has a sufficient thickness, the photoelectric conversion occurs in the semiconductor substrate SUB. For example, the thickness of the semiconductor substrate SUB (a length in a direction orthogonal to the first surface) in the second configuration example is set to 3 µm or more.

Figure 12:
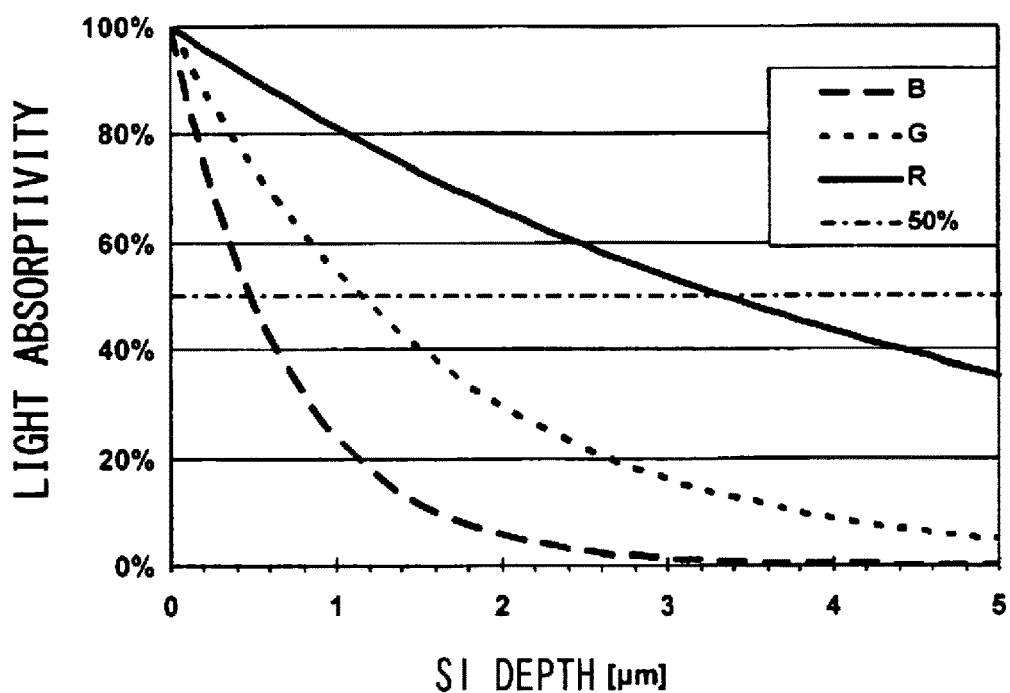
FIG. 12 is a graph illustrating an example of relation between a light absorptivity obtained by a silicon substrate and a thickness of the silicon substrate, regarding respective wavelengths of R, G, and B.

FIG. 12 is a graph illustrating an example of relation between a light absorptivity obtained by a silicon substrate and a thickness of the silicon substrate, regarding respective wavelengths of R, G, and B. A vertical axis in FIG. 12 indicates the light absorptivity in the silicon substrate, and a horizontal axis in FIG. 12 indicates the thickness (Si depth) of the silicon substrate. In the example of FIG. 12, a wavelength of B is 500 nm, a wavelength of G is 600 nm, and a wavelength of R is 750 nm. The longer the wavelength of light becomes, the greater the thickness of the silicon substrate required for absorbing 50% of light becomes, and with respect to the wavelength of R in FIG. 12, the thickness of the silicon substrate becomes about 3.2 µm. Although the wavelength of R is set to 750 nm in FIG. 12, a peak of a sensitivity region of R is in the vicinity of 650 nm. In the peak of the sensitivity region of R, the thickness of the silicon substrate required for absorbing the 50% of light becomes less than about 3.2 µm. Therefore, if the thickness of the silicon substrate is set to 3 µm or more, it is practically possible to cause sufficient photoelectric conversion in the semiconductor substrate SUB regarding light of any of R, G, and B.

Further, the n-type semiconductor substrate SUB in the second configuration example has an impurity concentration gradient so that the concentration increases from the first surface toward the semiconductor region n1 on the second surface side. Specifically, a first impurity concentration on the first surface side of the semiconductor substrate SUB becomes lower than a second impurity concentration of the semiconductor region n1 (first impurity concentration<second impurity concentration). Accordingly, in the n-type semiconductor substrate SUB, a potential of the semiconductor region n1 with high impurity concentration becomes lower than a potential on the first surface side with low impurity concentration. Therefore, in the second configuration example, it becomes easy for a charge to flow toward the semiconductor region n1, because of a difference in the potentials from the first surface side of the semiconductor substrate SUB to the semiconductor region n1, resulting in that a transfer omission in the photodiode PD is suppressed. Note that the impurity concentration of the semiconductor substrate SUB may also be rapidly changed stepwise in the thickness direction of the substrate, as long as it satisfies a condition that the impurity concentration on the second surface side is higher than that on the first surface side.

Note that in the second configuration example, the p-type semiconductor layer 34 is formed on the first surface of the semiconductor substrate SUB, and the p-type semiconductor layer p+ is formed on the second surface of the semiconductor substrate SUB, so that the photodiode PD has a p⁺np⁻ structure. Accordingly, in the second configuration example, it is possible to suppress a dark current in the photodiode PD.

Further, the impurity concentration of the semiconductor region n1 of the photodiode PD and the impurity concentration of the semiconductor region n2 of the storage diode SD are different to each other. For example, the impurity concentrations of the semiconductor regions n1 and n2 are respectively set so that a potential of the storage diode SD is positioned between a potential of the photodiode PD and a potential of the floating diffusion part FD, when the first global switch transistor GS1 is at a low level.

Therefore, when the first global switch transistor GS1 is at a high level, the charge generated in the semiconductor substrate SUB flows into the semiconductor region n2 of the storage diode SD via the semiconductor region n1, due to the difference in the potentials. Note that the shield layer p2 as the insulation section exists between the semiconductor region n2 of the storage diode SD and the semiconductor substrate SUB. For this reason, when the first global switch transistor GS1 is at a low level, the charge generated in the semiconductor substrate SUB is shielded by the shield layer p2, and thus never enters the semiconductor region n2 of the storage diode SD.

Further, in order to insulate mutually adjacent pixels, at boundaries of pixels PX, the p-type separating sections IS are formed. The separating sections IS in the second configuration example are formed to reach the first surface from the second surface of the semiconductor substrate SUB. The separating section IS is, for example, a p-type well. Note that the separating section IS may also be one including a trench. Further, at a position among the storage diode SD, the separating section IS, and the shield layer (p2), a p-type region 37 is formed. In like manner, at a position between the shield layer (p2) and the semiconductor substrate SUB, a p-type region 38 is formed, and at a position among the separating section IS, the semiconductor substrate SUB, and the photodiode PD, a p-type region 39 is formed. Note that the conductivity type of the semiconductor described in the second configuration example is only one example.

The imaging device 12b in the second configuration example can obtain not only the operations and effects ((1) to (5)) of the first configuration example, but also the following operations and effects.

If intense light is incident when the wiring layer MLY is positioned between the lightproof film of the lightproof section MS and the semiconductor substrate SUB, there is a possibility that excess light is leaked to the storage diode SD from an extremely small gap between the lightproof film and the imaging plane, to cause the generation of false signal (smear).

On the other hand, in the imaging device 12b in the second configuration example, the wiring layer MLY is positioned on the rear surface side of the incident surface, so that light is not directly incident on the storage diode SD, and in addition to that, the incident light is subjected to the photoelectric conversion by the semiconductor substrate SUB. For this reason, in the imaging device 12b, even if the intense light is incident, there is no chance that the light is leaked to the storage diode SD, so that it is possible to suppress the smear caused by the leakage of light to the storage diode SD, resulting in that the possibility of generation of the smear in the storage diode SD is significantly reduced.

<Third Configuration Example of Imaging Device>

Figure 13:
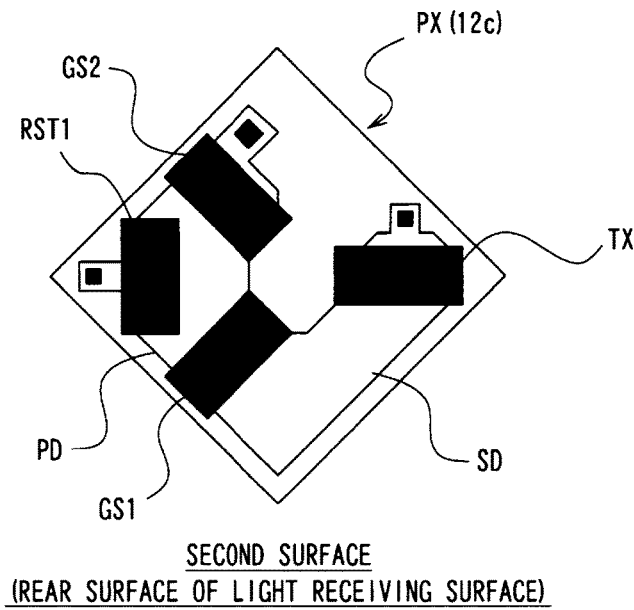
FIG. 13 is a diagram illustrating a pixel PX when seen from a rear surface side of a light receiving surface in a third configuration example.

Next, an imaging device 12c in a third configuration example will be described, as a modified example of the second configuration example. FIG. 13 is a diagram illustrating an example of pixel PX when seen from a side of a rear surface of a light receiving surface (second surface) in the imaging device 12c in the third configuration example.

Hereinafter, a point of difference between the imaging device 12c in the third configuration example and the imaging device in the second configuration example will be described. In the imaging device 12c in the third configuration example, an area of the photodiode PD is set to be smaller than an area of the storage diode SD, on the rear surface of the light receiving surface (second surface). Accordingly, an arrangement interval of the first reset transistor RST1, the first global switch transistor GS1, and the second global switch transistor GS2 becomes small, which enables to reduce the size of the pixel PX. Therefore, in the third configuration example, it becomes easy to increase the number of pixels in the imaging device. Note that when the rear surface irradiation type imaging device is employed, the photoelectric conversion of incident light is performed in the semiconductor substrate SUB as described above, so that no large influence is exerted even if the size of the photodiode PD on the second surface side is reduced.

Supplementary Items of Embodiments (Supplement 1): The imaging device in each of the first configuration example to the third configuration example may also have a stacked structure. For example, the imaging device 12 may also be configured by stacking a first substrate and a second substrate, and by electrically connecting the first substrate and the second substrate using a connection portion MB such as a micro-bump, for example. By making the imaging device have the stacked structure, it is possible to integrate circuits within a small space, resulting in that it becomes easy to increase the number of pixels in the imaging device.

Figure 14A:
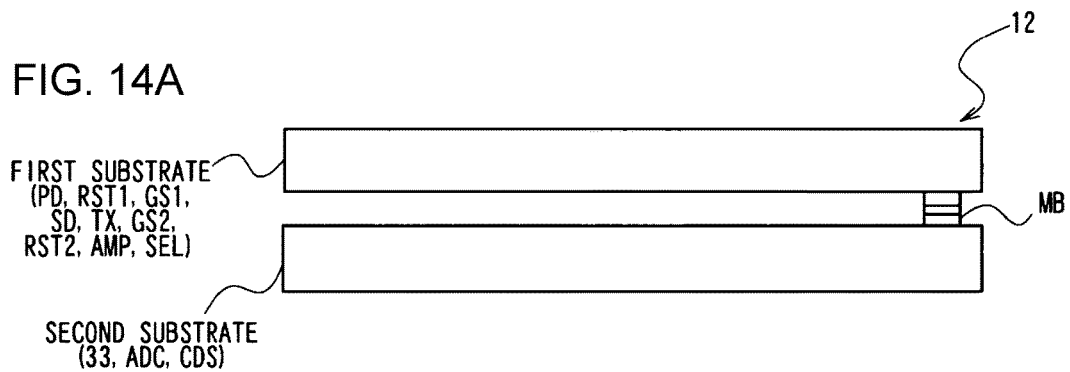
FIG. 14A and FIG. 14B are diagrams each illustrating an example of a stacked structure of an imaging device.

As one example, it is also possible to arrange, on the first substrate, the photodiode PD, the first reset transistor RST1, the first global switch transistor GS1, the storage diode SD, the transfer transistor TX, the second global switch transistor GS2, the second reset transistor RST2, the amplifying transistor AMP, and the selection transistor SEL, as illustrated in FIG. 14A. Further, it is also possible to arrange, on the second substrate (one example of signal processing substrate), the horizontal scanning part 33, the A/D conversion circuit, the CDS circuit and the like. Accordingly, signals in accordance with charges transferred to the floating diffusion parts FD of the respective pixels are processed in the second substrate.

Figure 14B:
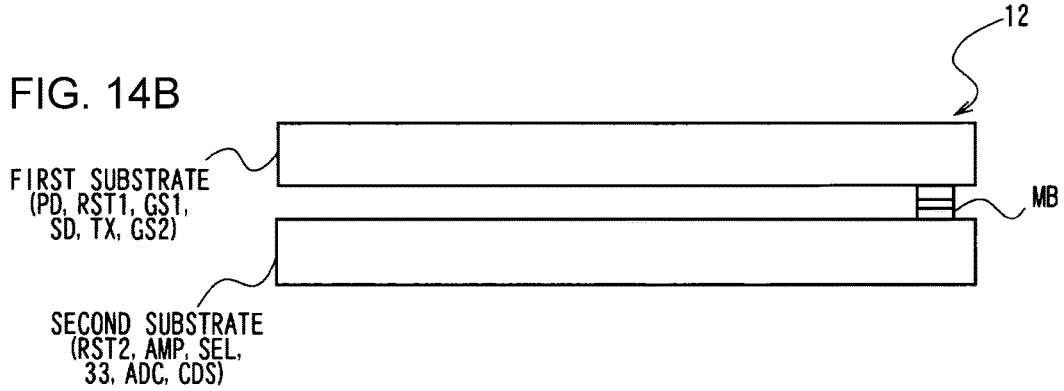

Further, it is also possible to arrange, on the first substrate, the photodiode PD, the first reset transistor RST1, the first global switch transistor GS1, the storage diode SD, the transfer transistor TX, and the second global switch transistor GS2, as illustrated in FIG. 14B. Further, it is also possible to arrange, on the second substrate, the second reset transistor RST2, the amplifying transistor AMP, the selection transistor SEL, the vertical signal lines VL, the horizontal scanning part 33, the A/D conversion circuit, the CDS circuit and the like.

Figure 15:
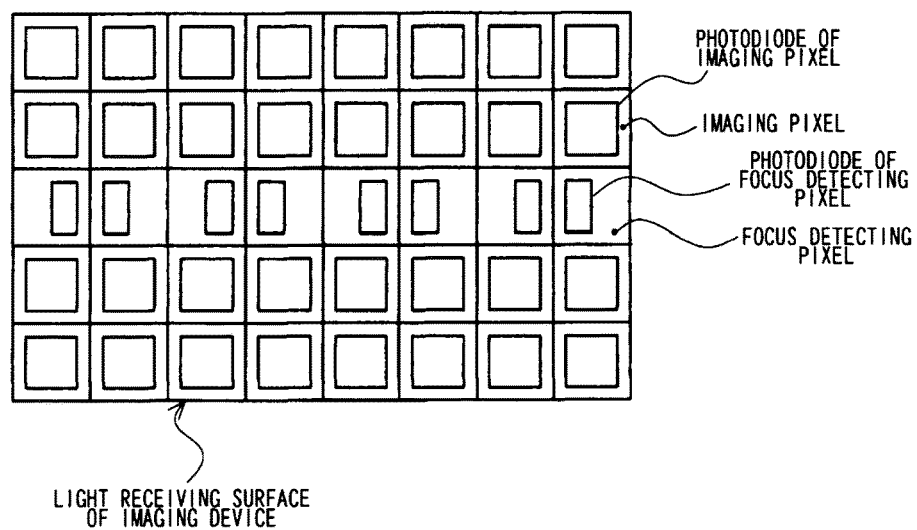
FIG. 15 is a diagram illustrating another example of a pixel arrangement as a modified example of the second configuration example.

(Supplement 2): The configuration of the rear surface irradiation type imaging device including the storage section described in the aforementioned second configuration example can also be applied to a case where a pixel arrangement different from that of the above-described embodiment is employed. For example, in an imaging device in which imaging pixels and focus detecting pixels are arrayed in a square lattice shape as illustrated in FIG. 15, a configuration of the focus detecting pixel or the imaging pixel may also be set to one as in the second configuration example (FIG. 9, for example).

(Supplement 3): The above-described configuration examples describe the case where the center of optical axis of the microlens MLN of each pixel is aligned with the boundary between the lightproof section MS and the opening (photoelectric conversion section). However, in the present invention, it is also possible to design such that the center of optical axis of the microlens MLN of each of the respective pixels including the first pixel to the sixth pixel is positioned on the photoelectric conversion section side, relative to the boundary between the lightproof section MS and the opening (photoelectric conversion section). For example, it is also possible to design such that the center of optical axis of the microlens MLN is positioned at a center of gravity of the opening.

(Supplement 4): In the above-described second configuration example, the p-type semiconductor layer 34 provided on the first surface of the semiconductor substrate SUB may also be omitted.

(Supplement 5): The configuration example of the above-described imaging device is only one example of the present invention. For example, in the imaging device of the present invention, it is also possible to omit the first reset transistor RST1, and the second global switch transistor GS2 from the pixel PX.

(Supplement 6): Although the above-described embodiments describe the digital camera 1 in which the interchangeable lens 2 is mounted on the camera body 3, as an example of imaging unit, the present invention can also be applied to, for example, a lens integrated-type digital camera. Further, the imaging unit of the present invention may also be one which is mounted on, for example, an electronic device having a camera module (for example, a smartphone, a mobile phone, a tablet type computer, and the like).

(Supplement 7): Although the above-described embodiments describe a case where the imaging device 12 uses the color filters of primary color system (RGB), it is also possible to use color filters of complementary color system (CMY).

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to exact construction and operation illustrated and described, and accordingly all suitable modifications and equivalents may be resorted to, falling within the scope thereof.

The invention claimed is:

1. An imaging device comprising:
an optical element on which light is incident;
a member having an opening for passing light from the optical element and a lightproof section for shielding the light from the optical element;
a first semiconductor element, which is a semiconductor element for converting light into a charge, having (i) a first semiconductor region arranged on a first surface side on which light from the opening is incident and (ii) a second semiconductor region, arranged on a second surface side opposite the first surface side, having a higher impurity concentration than the first semiconductor region;
a transfer gate arranged on the second surface side and for transferring a charge of the first semiconductor element; and
a second semiconductor element having a third semiconductor region to which the charge from the first semiconductor element is transferred by the transfer gate, wherein:
the first semiconductor region has an impurity concentration gradient in which its impurity concentration increases from the first surface side toward the second semiconductor region; and
the lightproof section, the first semiconductor element, and the second semiconductor element are arranged in this order in an optical axis direction of the optical element.

2. The imaging device according to claim 1, wherein the lightproof section, the first semiconductor region, and the second semiconductor element are arranged in this order in the optical axis direction of the optical element.

3. The imaging device according to claim 1, wherein the opening, the first semiconductor region, and the second semiconductor region are arranged in this order in the optical axis direction of the optical element.

4. The imaging device according to claim 1, wherein the second semiconductor element is formed by a semiconductor of a same conductivity type as the first semiconductor element and the third semiconductor region has an impurity concentration higher than the impurity concentration of the second semiconductor region.

5. The imaging device according to claim 4, further comprising
an insulation section formed by a semiconductor of a conductivity type different from the conductivity type of the first semiconductor element and that prevents the charge in the first semiconductor element from entering the second semiconductor element.

6. The imaging device according to claim 1, further comprising
a first semiconductor section formed by a semiconductor of a conductivity type different from a conductivity type of the first semiconductor element and formed on the first surface side.

7. The imaging device according to claim 1, further comprising
a second semiconductor section formed by a semiconductor of a conductivity type different from a conductivity type of the first semiconductor element and formed on the second surface side.

8. The imaging device according to claim 1, further comprising:
a first pixel and a second pixel adjacent to the first pixel, wherein:

each of the first pixel and the second pixel includes the first semiconductor element and the second semiconductor element; and the imaging device further comprises a separating section separating the first semiconductor element of the first pixel and the first semiconductor element of the second pixel.

9. The imaging device according to claim 8, wherein the separating section has a semiconductor of a conductivity type different from a conductivity type of the first semiconductor element.

10. The imaging device according to claim 8, wherein the separating section has a trench.

11. An imaging unit, comprising:
an infrared cut filter; and
the imaging device according to claim 1, wherein
light passed through the infrared cut filter enters the imaging device.

12. The imaging unit according to claim 11, wherein a thickness of the first semiconductor element in the optical axis direction is 3 μm or more.

13. An imaging device comprising:
an optical element on which light is incident;
a member having an opening for passing light from the optical element and a lightproof section for shielding the light from the optical element;
a first semiconductor element, which is a semiconductor element for converting light into a charge, having (i) a first semiconductor region arranged on a first surface side on which light from the opening is incident and (ii) a second semiconductor region, arranged on a second surface side opposite the first surface side, having a higher impurity concentration than the first semiconductor region;
a transfer gate arranged on the second surface side and for transferring a charge of the first semiconductor element; and
a second semiconductor element having a third semiconductor region to which the charge from the first semiconductor element is transferred by the transfer gate, wherein:
the first semiconductor region has an impurity concentration gradient in which its impurity concentration increases from the first surface side toward the second semiconductor region; and
the first semiconductor element is arranged between the lightproof section and the second semiconductor element in an optical axis direction of the optical element.

14. The imaging device according to claim 13, wherein the first semiconductor region is arranged between the lightproof section and the second semiconductor element in the optical axis direction of the optical element.

15. The imaging device according to claim 13, wherein the first semiconductor region is arranged between the opening and the second semiconductor region in the optical axis direction of the optical element.

16. The imaging device according to claim 13, wherein the second semiconductor element is formed by a semiconductor of a same conductivity type as the first semiconductor element and the third semiconductor region has an impurity concentration higher than the impurity concentration of the second semiconductor region.

17. The imaging device according to claim 13, further comprising
an insulation section formed by a semiconductor of a conductivity type different from the conductivity type of the first semiconductor element and that prevents the charge in the first semiconductor element from entering the second semiconductor element.

18. The imaging device according to claim 13, further comprising
a first semiconductor section, formed by a semiconductor of a conductivity type different from a conductivity type of the first semiconductor element, on the first surface side.

19. The imaging device according to claim 13, further comprising
a second semiconductor section, formed by a semiconductor of a conductivity type different from a conductivity type of the first semiconductor element, on the second surface side.

20. The imaging device according to claim 13, further comprising:
a first pixel and a second pixel adjacent to the first pixel, wherein:
each of the first pixel and the second pixel includes the first semiconductor element and the second semiconductor element; and
the imaging device further comprises a separating section separating the first semiconductor element of the first pixel and the first semiconductor element of the second pixel.

21. The imaging device according to claim 20, wherein the separating section has a semiconductor of a conductivity type different from a conductivity type of the first semiconductor element.

22. The imaging device according to claim 20, wherein the separating section has a trench.

23. An imaging unit, comprising:
an infrared cut filter; and
the imaging device according to claim 13, wherein light passed through the infrared cut filter enters the imaging device.

24. The imaging unit according to claim 23, wherein a thickness of the first semiconductor element in the optical axis direction is 3 μm or more.

* * * * *